United States Patent [19]

Dunsmore

[11] Patent Number: 4,962,359

[45] Date of Patent: Oct. 9, 1990

[54] DUAL DIRECTIONAL BRIDGE AND BALUN USED AS REFLECTOMETER TEST SET

[75] Inventor: Joel P. Dunsmore, Sebastopol, Calif.

[73] Assignee: Hewlett-Packard Company, Palo Alto, Calif.

[21] Appl. No.: 373,714

[22] Filed: Jun. 29, 1989

[51] Int. Cl.$^5$ .................... G01R 27/28; G01N 22/00
[52] U.S. Cl. .................... 324/638; 324/637; 324/642; 324/646; 324/648
[58] Field of Search .................... 324/637–639, 324/630, 642, 646, 648; 333/26

[56] References Cited

U.S. PATENT DOCUMENTS

| | | | |
|---|---|---|---|
| 3,800,218 | 3/1974 | Shekel | 324/642 X |
| 4,495,807 | 1/1985 | Field et al. | 324/642 X |
| 4,588,970 | 5/1986 | Donecker et al. | 324/638 X |

FOREIGN PATENT DOCUMENTS 1448302 12/1988 U.S.S.R. .................... 324/637

Primary Examiner—Reinhard J. Eisenzopf
Assistant Examiner—Jack B. Harvey
Attorney, Agent, or Firm—William C. Milks, III

[57] ABSTRACT

A test set for use in measuring S-parameters with a network analyzer includes a first directional bridge, a second directional bridge and a single balun with two outputs mounted in an RF housing. A test signal from an RF signal source is transmitted through the test set to a device under test. The first directional bridge separates a signal from the device under test and the test signal, and provides the signal from the device under test to a coupled port. The second directional bridge separates the test signal and the signal from the device under test and provides the test signal to a reference port. The balun includes a coaxial transmission line with its outer conductor grounded at an intermediate location to define first and second balun sections. Ferrite beads are mounted on each of the balun sections. The ends of the first and second balun sections are coupled to the first and second directional bridges, respectively.

22 Claims, 16 Drawing Sheets

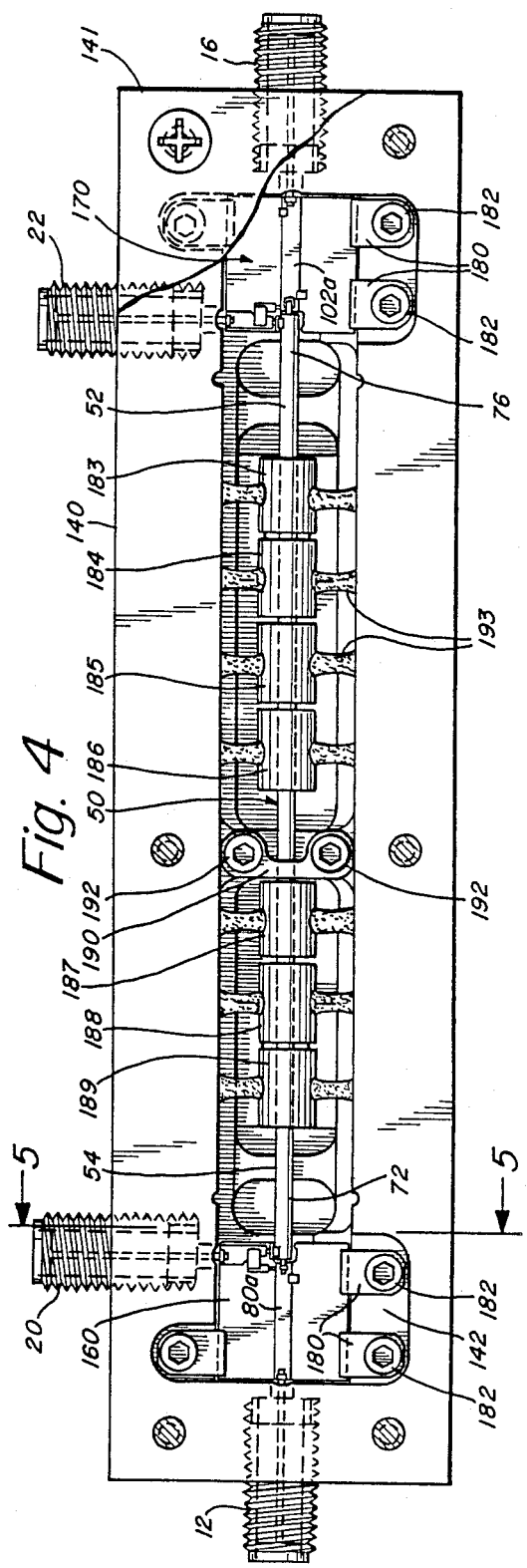
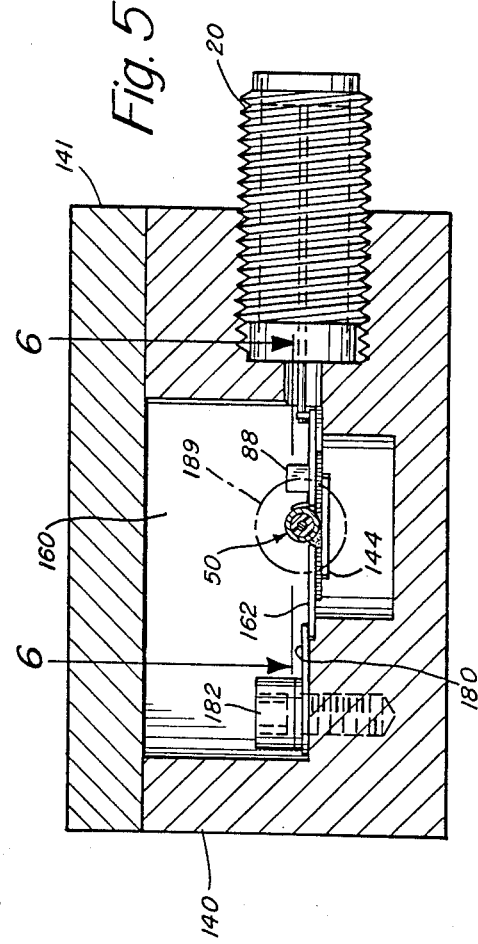
Fig. 4
Fig. 5

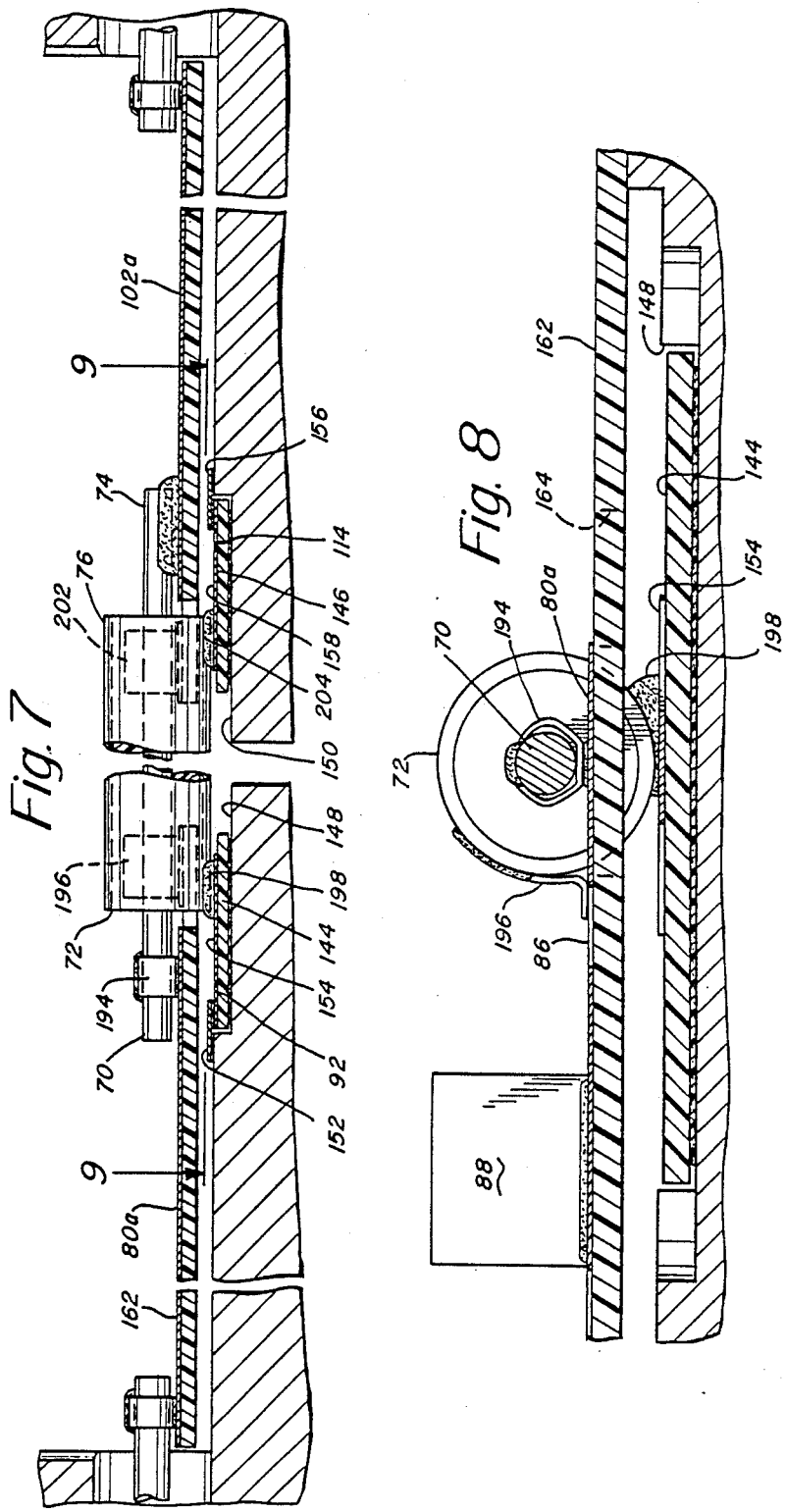

DUAL DIRECTIONAL BRIDGE AND BALUN USED AS REFLECTOMETER TEST SET

FIELD OF THE INVENTION

This invention relates generally to the field of instruments for network analysis and, more particularly, to a test set used with a high frequency network analyzer for separating an input test signal to a device under test and a signal from the device under test.

BACKGROUND OF THE INVENTION

Network analyzers are instruments that measure transfer and/or impedance functions of networks. A sine wave signal source stimulates the device under test. Since transfer and impedance functions are ratios of various voltages and currents, a means for separating the signals of interest from the measurement ports of the device under test is required. The network analyzer detects the separated signals, forms the desired signal ratios and displays the results.

Measurements of voltages and currents are difficult at high frequencies. High frequency network behavior is best described using transmission line theory. Scattering parameters, or S-parameters, were developed to characterize networks at high frequencies. S-parameters define the ratios of reflected and transmitted traveling waves measured at the network ports. In order to measure the S-parameters, it is necessary to separate the transmitted or incident signal and the signal from the device under test. A device known as a test set is utilized to interconnect the test signal source, the device under test and the network analyzer. For example, in the case of reflection measurements, the test set supplies a test signal to the device under test and separates incident and reflected signals for measurement and analysis by the network analyzer. The test set provides a representation of the incident signal on a reference port and a representation of the reflected signal on a coupled port.

Prior art S-parameter test sets have utilized a directional bridge for separating the incident signal and the reflected signal. In one prior art test set, the Model HP 85046A/B S-Parameter Test Set manufactured by Hewlett-Packard Company, the incident signal is provided to the reference port through a power splitter, and a symmetric wheatstone bridge is used for separating incident and reflected signals and providing the reflected signal to the coupled port. While this device provides generally satisfactory performance, it has certain limitations. The power splitter and the directional bridge do not track over a wide range of frequencies because of their different structures. The bridge and the power splitter each have 6 dB loss, resulting in 12 dB loss to the test port. As a result, the power available to the device under test is limited. Other limitations include a source mismatch due to a long RF cable interconnecting the power splitter and the bridge, and degraded performance at the upper and lower ends of the frequency range.

Another prior art S-parameter test set, the Model HP 85047A S-Parameter Test Set manufactured by Hewlett-Packard Company, utilizes a first directional bridge for monitoring the incident signal at the reference port and a second directional bridge for monitoring the reflected signal. The bridges are matched, thereby providing improved tracking. In addition, each bridge is asymmetric and has only 1.5 dB loss for a total loss of 3 dB to the test port. Each bridge is packaged in a separate RF housing. While the test set utilizing two bridges has improved performance in comparison with the test set utilizing a power splitter, it has several limitations. The two bridges are relatively expensive, since two precision-milled housings are required. In addition, the two bridge assemblies have a relatively large volume and are not well suited for compact products. Separation of the bridges by a long RF cable causes a poor match due to standing wave ratio interactions. Since the two bridges are in different packages, temperature gradients can cause them to change coupling at different rates. Finally, performance is degraded at low frequencies.

It is a general object of the present invention to provide an improved S parameter test set.

It is another object of the present invention to provide an S-parameter test set capable of operating over a wide frequency range.

It is a further object of the present invention to provide an S-parameter test set which is small in volume and low in cost.

It is a further object of the present invention to provide an S-parameter test set having close tracking between a reference channel and a coupled channel over a wide frequency range.

It is yet another object of the present invention to provide an S-parameter test set wherein the source and the device under test are well matched over a wide frequency range.

SUMMARY OF THE INVENTION

According to the present invention, these and other objects and advantages are achieved in a test set for separating an incident signal supplied through a test port to a device under test and a signal from the device under test. The signal from the device under test is a reflected signal or a transmitted signal, depending on the test configuration. The test set comprises a first directional bridge for separating the signal from the device under test and the incident signal and providing the signal from the device under test to a coupled port, a second directional bridge for separating the incident signal and the signal from the device under test and providing the incident signal to a reference port, and dual balun means for receiving unbalanced inputs through an RF source port and the test port and providing separate balanced inputs to the first directional bridge and the second directional bridge.

The dual balun means permits balanced inputs to be provided to the first and second directional bridges from a single balun structure. The dual balun means preferably comprises a coaxial transmission line having an inner conductor and an outer conductor and having a first end and a second end, means for coupling the outer conductor to ground at a location intermediate the first and second ends, thereby defining first and second sections of the coaxial transmission line, inductive elements on the first and second sections of the coaxial transmission line, means for coupling the first end of the coaxial transmission line to the first directional bridge, and means for coupling the second end of the coaxial transmission line to the second directional bridge. The inductive elements preferably comprise ferrite beads on each section of the coaxial transmission line.

The test set further includes an RF housing enclosing the first and second directional bridges and the dual balun means. In a preferred configuration, the first directional bridge comprises a first thin-film circuit means mounted adjacent to the first end of the coaxial transmission line, and the second directional bridge comprises a second thin-film circuit means mounted adjacent to the second end of the coaxial transmission line. The first and second thin-film circuit means each utilize a suspended substrate configuration wherein one or more of the bridge components are mounted on an upper substrate, and one or more of the bridge components are mounted on a lower substrate.

According to another aspect of the invention, the first directional bridge includes a first DC blocking capacitor, and the first DC blocking capacitor is selected to match inductive element on the first section of the coaxial transmission line. Similarly, the second directional bridge includes a second DC blocking capacitor, and the second DC blocking capacitor is selected to match the inductive element on the second section of the coaxial transmission line. The matching of DC blocking capacitors to inductive elements extends the low frequency performance of the test set.

The test set in accordance with the present invention can be utilized for measuring both reflection and transmission S-parameters of a device under test. In a single test set configuration, the test port of the test set is connected to one of the ports of the device under test. The reflected signal is measured at the coupled port, and a transmitted signal is measured at the other port of the device under test. In a bi-directional S-parameter measurement configuration, test ports of two identical test sets are connected to the ports of the device under test. An RF signal source can be switched to the source port of either test set to provide reflection and transmission measurements in either direction.

BRIEF DESCRIPTION OF THE DRAWINGS

For a better understanding of the present invention, together with other and further objects, advantages and capabilities thereof, reference is made to the accompanying drawings which are incorporated herein by reference and in which:

FIG. 4 is a top plan view of the test set assembly with, the cover partially broken away;

FIG. 5 is a transverse cross-section taken along line 5—5 of FIG. 4;

FIG. 7 is a partial longitudinal cross-section taken along line 7—7 of FIG. 6;

FIG. 8 is a partial transverse cross-section taken along line 8—8 of FIG. 6;

DETAILED DESCRIPTION OF THE INVENTION

Figure 1:
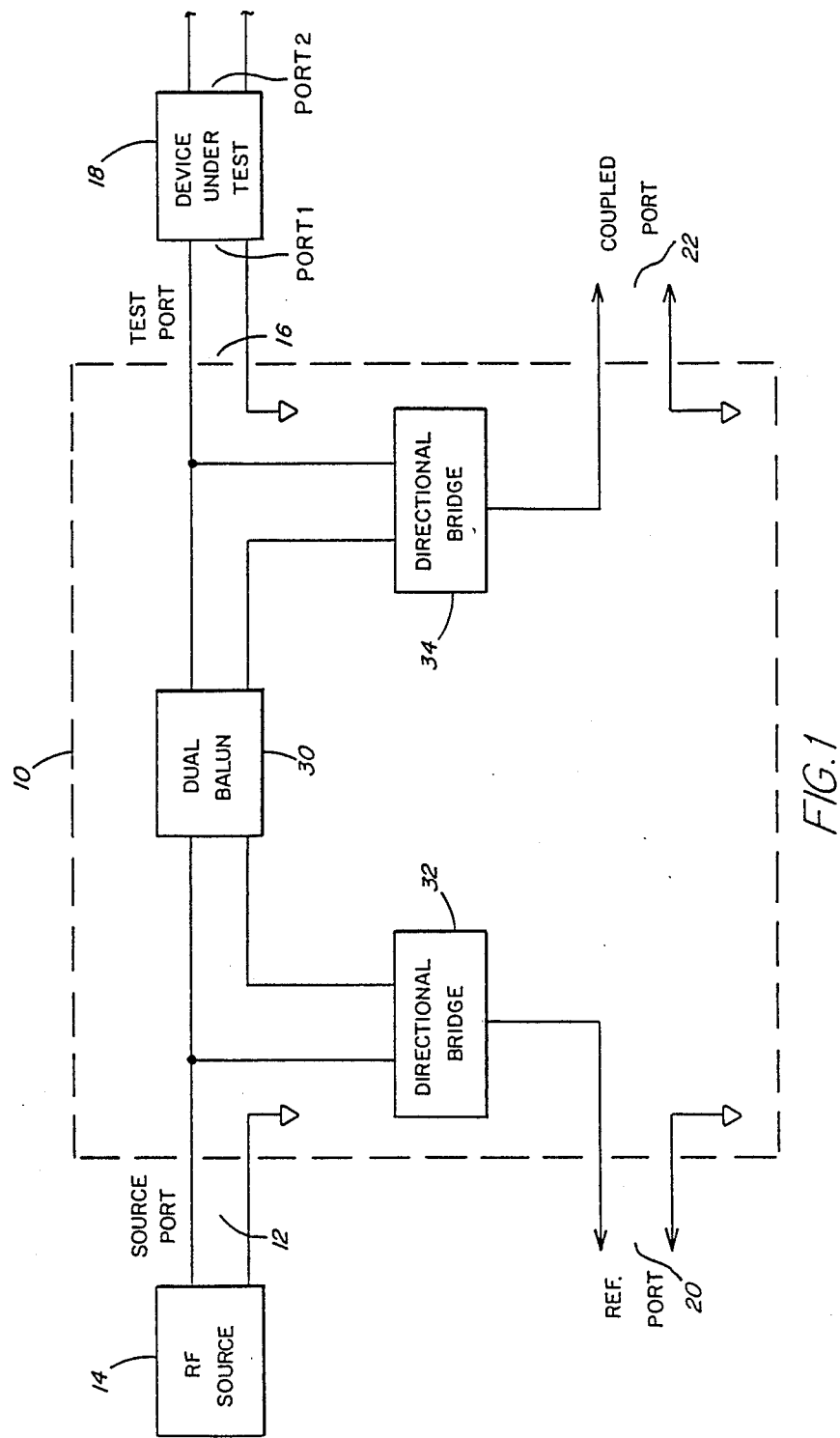
FIG. 1 is a block diagram of a test set in accordance with the present invention illustrating its connection to an RF source and a device under test.

A block diagram of a network analysis arrangement utilizing a test set in accordance with the present invention is shown in FIG. 1. A test set 10 has a source port 12 coupled to an RF signal source 14 and a test port 16 coupled to port 1 of a device under test 18. A test signal from RF signal source 14 is coupled through test set 10 to the device under test 18. The test set 10 further includes a reference port 20 and a coupled port 22. The reference port 20 and the coupled port 22 are each coupled to a sampler in a network analysis instrument (not shown). The reference port 20 provides a representation of the test signal, or incident signal, supplied to the device under test 18. The coupled port 22 provides a representation of a signal that is reflected by the device under test 18. A port 2 of the device under test 18 can be coupled to a sampler in the network analysis instrument for transmission measurements.

The test set 10 includes a dual balun 30, a directional bridge 32 and a directional bridge 34. The dual balun 30 has unbalanced connections to source port 12 and to test port 16, and balanced connections to directional bridge 32 and to directional bridge 34. Directional bridge 32 has an unbalanced connection to reference port 20, and directional bridge 34 has an unbalanced connection to coupled port 22.

In operation, a test signal is supplied by RF source 14 through source port 12. The test signal is transmitted through dual balun 30 to the device under test 18. A portion of the test signal is reflected by the device under test 18 back through test port 16 to the test set 10. The directional bridge 32 is configured such that a portion of the test signal passes through the directional bridge 32 to reference port 20, while the reflected signal is blocked by directional bridge 32. The directional bridge 34 is configured such that the test signal is blocked from reaching coupled port 22, while a portion of the reflected signal passes through directional bridge 34 to coupled port 22. Thus, the test signal and the reflected signal are separated on reference port 20 and coupled port 22, respectively. A portion of the test signal is transmitted through the device under test 18 from port 1 to port 2 and can be measured. The construction and operation of test set 10 are described in detail hereinafter.

Figure 1A:
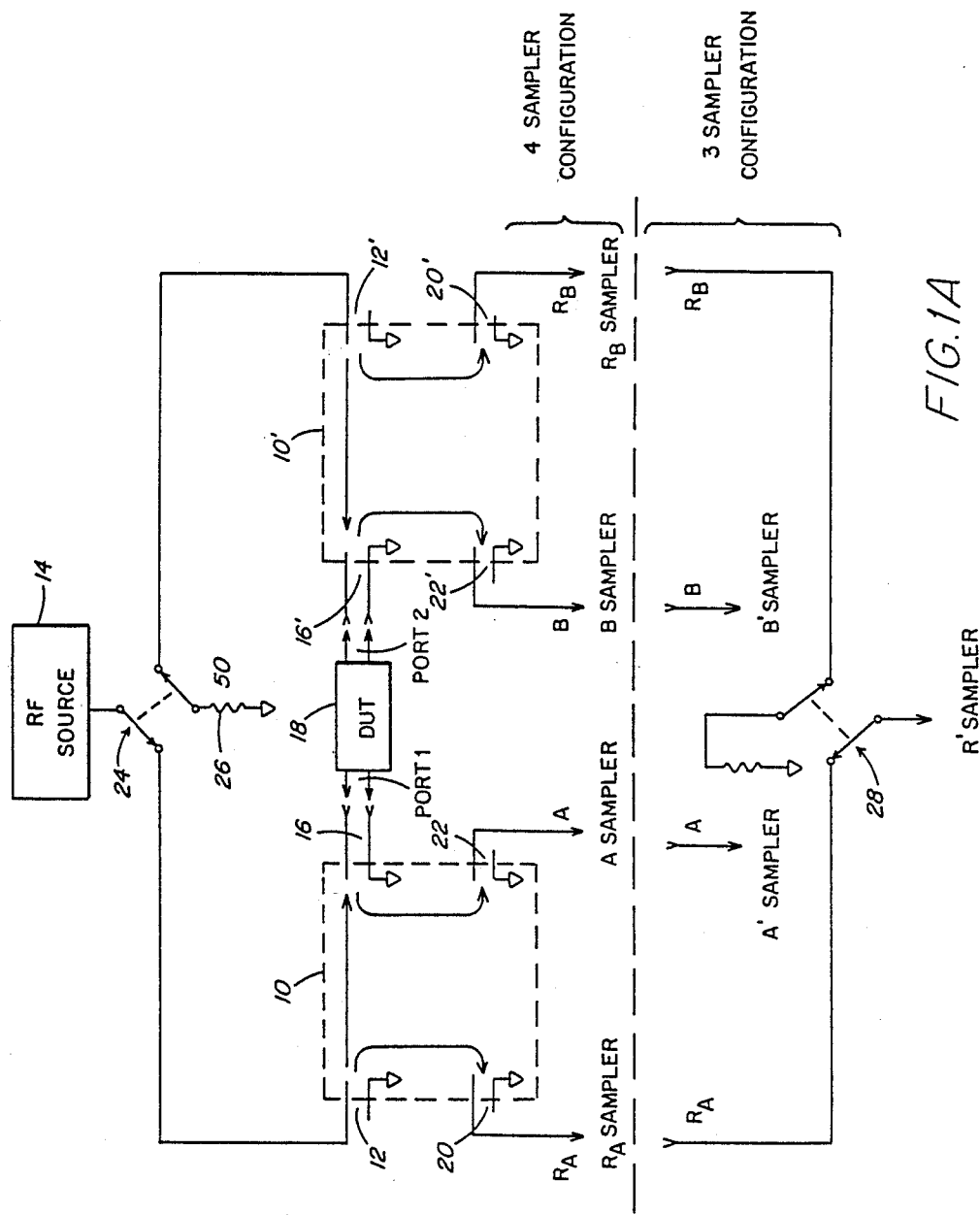
FIG. 1A is a block diagram illustrating a configuration for bidirectional S-parameter measurement.

A configuration for bi-directional S-parameter measurements is shown in FIG. 1A. First test set 10 has test port 16 coupled to port 1 of device under test 18, as in FIG. 1. A second test set 10' has a test port 16' coupled to port 2 of device under test 18. RF signal source 14 is coupled to a double-pole, double throw switch 24. In one position of switch 24, the RF signal source 14 is coupled to source port 12 of test set 10, and a terminating resistor 26, typically 50 ohms, is coupled to port 12' of test set 10'. In the other position of switch 24, RF signal source 14 is coupled to source port 12' of test set 10', and terminating resistor 26 is coupled to source port 12 of test set 10.

In one configuration, reference port 20, coupled port 22, reference port 20' and coupled port 22' are individually coupled to samplers in the network analysis instrument. An example of a unit containing four samplers is a Model 8511 manufactured by Hewlett-Packard Company. The Model 8511 is used in conjunction with a Model 8510.

In an alternate configuration, reference port 20 and reference port 20' are coupled through a switch 28 to a single reference sampler in the network analysis instrument, and coupled ports 22 and 22' are individually coupled to samplers. An example of a unit containing three samplers is a Model 8753 network analyzer manufactured by Hewlett Packard Company.

The configuration shown in FIG. 1A can be used to measure both reflection and transmission S-parameters at port 1 and port 2 of the device under test. When the RF signal source 14 is connected by switch 24 to source port 12, the reflected signal from port 1 of device under test 18 is measured at coupled port 22, the transmitted signal is measured at coupled port 22', and the test signal is measured at reference port 20. When the RF signal source 14 is connected by switch 24 to source port 12' the reflected signal from port 2 of device under test 18 is measured at coupled port 22', the transmitted signal is measured at coupled port 22 and the test signal is measured at reference port 20'.

Figure 2A:
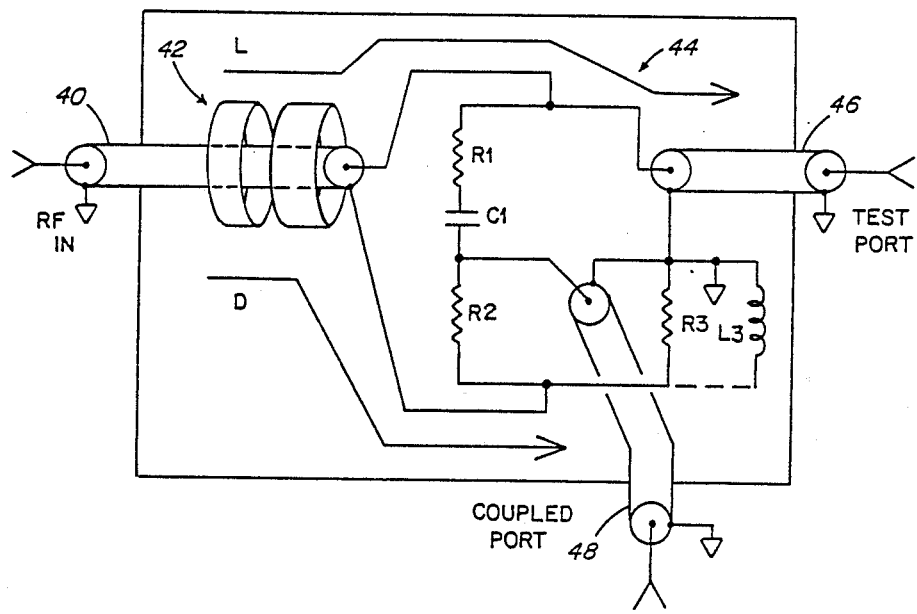
FIG. 2A is a schematic diagram illustrating operation of a directional bridge for an incident signal.
Figure 2B:
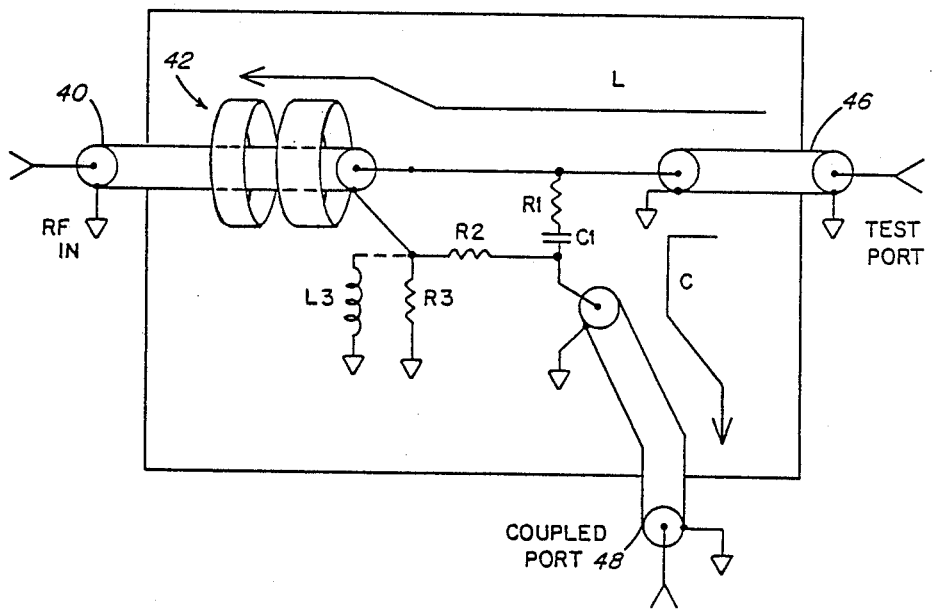
FIG. 2B is a schematic diagram illustrating operation of the directional bridge for a reflected signal.

A directional bridge is illustrated in FIGS. 2A and 2B. An RF test signal is coupled from an RF input port through a coaxial line 40 and through a balun 42 which provides a balanced input to a bridge 44. A series connection of a resistor R1 and a capacitor C1 forms one arm of bridge 44. Resistors R2 and R3 form second and third arms, respectively, of bridge 44, and a test port 46 is connected as a fourth arm of bridge 44. Test port 46 has an impedance $Z_p$. A coupled port 48 is connected across the null points of bridge 44 with respect to the RF input port. Capacitor C1 is used for DC blocking and has a negligible impedance at frequencies of interest. In the null condition when $R1/R2=Z_p/R3$, a null condition exists and the test signal, represented by the arrows L and D, does not reach coupled port 48.

In FIG. 2B the same circuit as that shown in FIG. 2A has been redrawn to illustrate coupling of a reflected signal from the test port 46. With respect to the test port 46, the coupled port 48 is in one leg of the bridge. Thus, reflected power, represented by the arrows C and L, reaches the coupled port 48. In the balanced condition of the bridge, no reflected current flows through resistor R2. A portion of the reflected signal also returns to the RF input port 40. Thus, the test signal is separated from the reflected signal so that only the reflected signal reaches coupled port 48.

Figure 3:
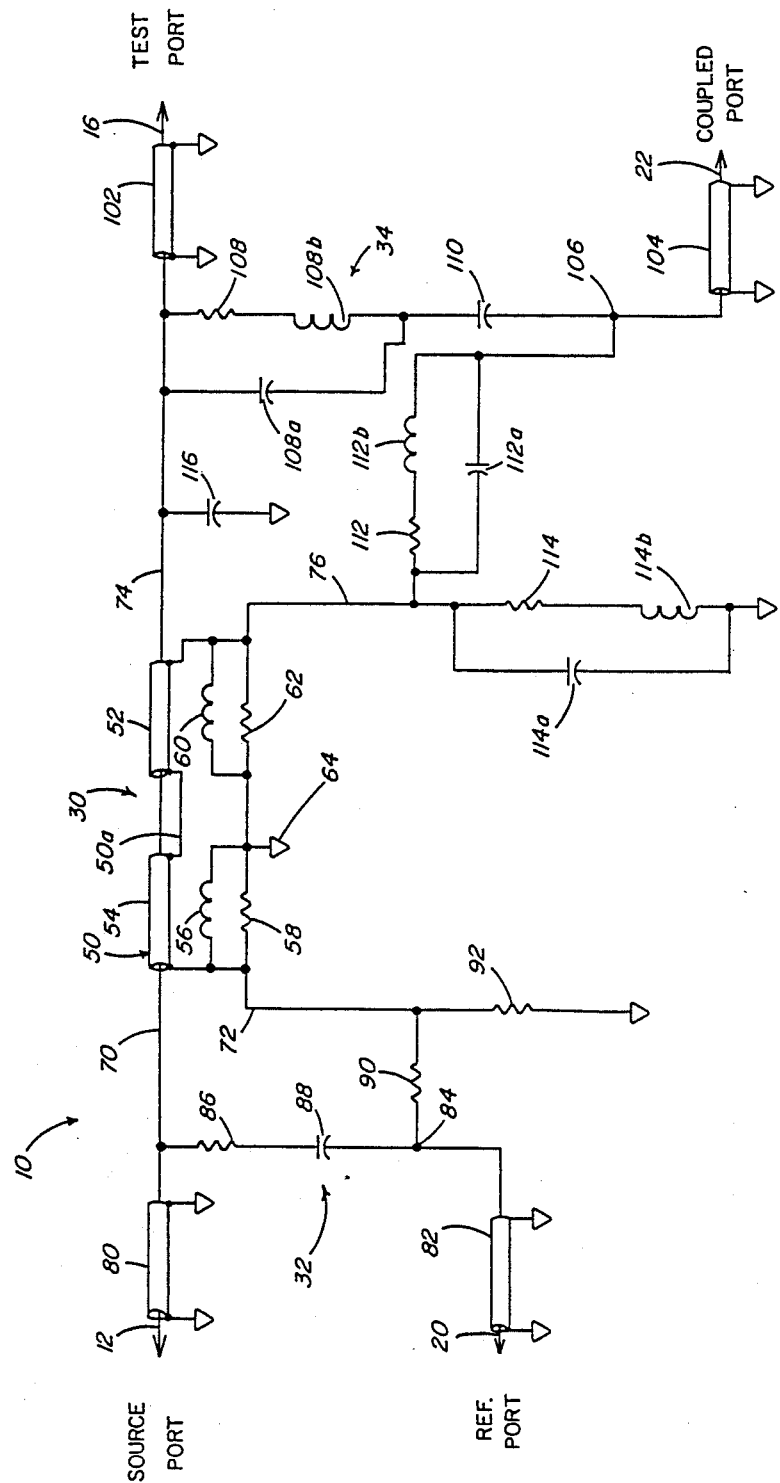
FIG. 3 is a schematic diagram wherein elements of the test set are modeled as lumped circuit elements.

A lumped element model of the test set 10 is shown in schematic form in FIG. 3. The dual balun 30 comprises a coaxial transmission line 50, including a first balun section 52 and a second balun section 54. An outer conductor 50a of coaxial transmission line 50 is effectively coupled to ground at an intermediate point between balun sections 52 and 54. As described hereinafter, ferrite beads are mounted on sections 52 and 54 of coaxial transmission line 50. The impedance of the ferrite beads on second balun section 54 is represented by an inductor 56 and a resistor 58. The impedance of the ferrite beads on first balun section 52 is represented by an inductor 60 and a resistor 62. The effective grounding of the outer conductor 50a is represented by ground 64. The external connections to dual balun 30 are made to center conductor 70 and outer conductor 72 of second balun section 54 and to center conductor 74 and outer conductor 76 of first balun section 52.

Source port 12 is coupled through a transmission line 80 to the center conductor 70 of balun section 54. Reference port 20 is coupled through a transmission line 82 to a node 84. A resistor 86 and a capacitor 88 are coupled in series between center conductor 70 and node 84. A resistor 90 is coupled between node 84 and the outer conductor 72 of balun section 54. A resistor 92 is coupled between outer conductor 72 and RF ground. Resistors 86, 90 and 92 correspond to resistors R1, R2 and R3, respectively, in FIGS. 2A and 2B and form the resistive elements of directional bridge 32. The capacitor 88 corresponds to capacitor C1 in FIGS. 2A and 2B.

Test port 16 is coupled through a transmission line 102 to the center conductor 74 of balun section 52. Coupled port 22 is coupled through a transmission line 104 to a node 106. A resistor 108 and a capacitor 110 are coupled in series between center conductor 74 and node 106. A capacitor 108a and an inductor 108b represent parasitic capacitance and inductance, respectively, of resistor 108. A resistor 112 is coupled between outer conductor 76 of balun section 52 and node 106. A capacitor 112a and an inductor 112b represent the parasitic capacitance and inductance, respectively, of resistor 112. A resistor 114 is coupled between outer conductor 76 and RF ground. A capacitor 114a and an inductor 114b represent the parasitic capacitance and inductance, respectively, of resistor 114. Resistors 108, 112 and 114 correspond to resistors R1, R2 and R3, respectively, in FIGS. 2A and 2B and form the resistive elements of directional bridge 34. Capacitor 110 corresponds to capacitor C1 in FIGS. 2A and 2B. A capacitor 116 represents a parasitic capacitance between center conductor 74 and RF ground.

The dual balun 30 is a single balun which provides a balanced input to directional bridge 32 on center conductor 70 and outer conductor 72, and a balanced input to directional bridge 34 on center conductor 74 and outer conductor 76. In a preferred embodiment, the bridge elements have the following values:

| Component | Value |
| --- | --- |
| resistor 86 | 265 ohms |
| capacitor 88 | 4700 picofarads |
| resistor 90 | 50 ohms |
| resistor 92 | 10 ohms |
| resistor 108 | 261 ohms |
| capacitor 110 | 6800 picofarads |
| resistor 112 | 50 ohms |
| resistor 114 | 10 ohms |

These values provide balanced operation for 50 ohms impedance at each of the ports of the test set 10.

The low frequency performance of the test set is improved by matching the value of the blocking capacitor 88 to the inductance 56 of the ferrite beads on balun section 54 and by matching the value of the blocking capacitor 110 to the inductance 60 of the ferrite beads on balun section 52. Referring again to FIG. 2A, the parasitic inductance of the ferrite beads is represented by L3. It can be shown that when $L3/C1=R1·R3$, the bridge is maintained in a balanced condition for all frequencies. As a result, low frequency performance is greatly improved.

A preferred test set structure in accordance with the present invention is illustrated in FIGS. 4-9. The circuit shown in FIG. 3 and described hereinabove is mounted in a metal RF housing 140 in which an elongated RF cavity 142 has been milled. RF connectors mounted to housing 140 constitute source port 12, reference port 20, coupled port 22 and test port 16.

Figure 9:
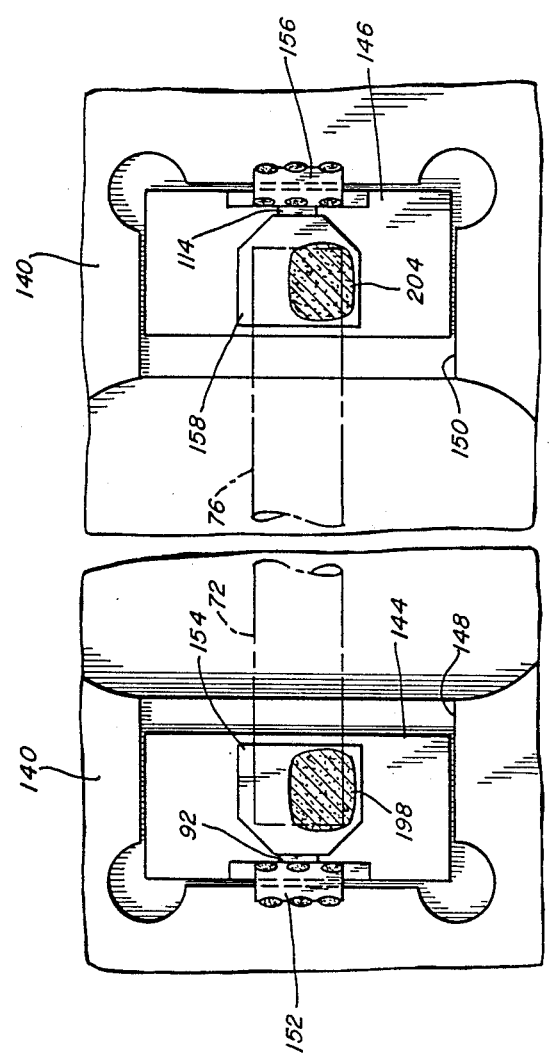
FIG. 9 is a partial longitudinal cross-section taken along line 9—9 of FIG. 7.
Figure 10A:
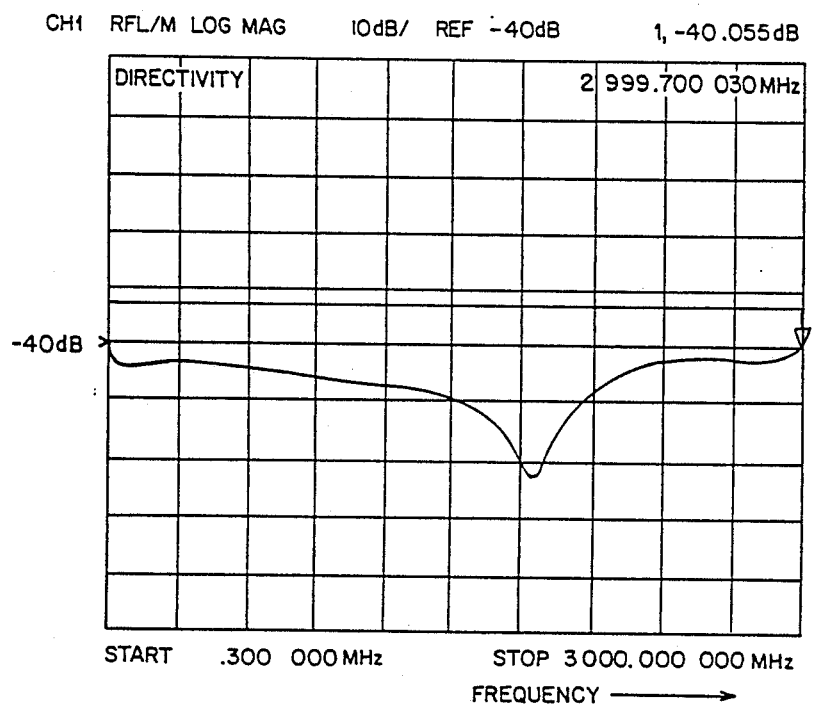
FIGS. 10A-10D are graphic representations of the performance of a test set in accordance with the present invention.
Figure 10B:
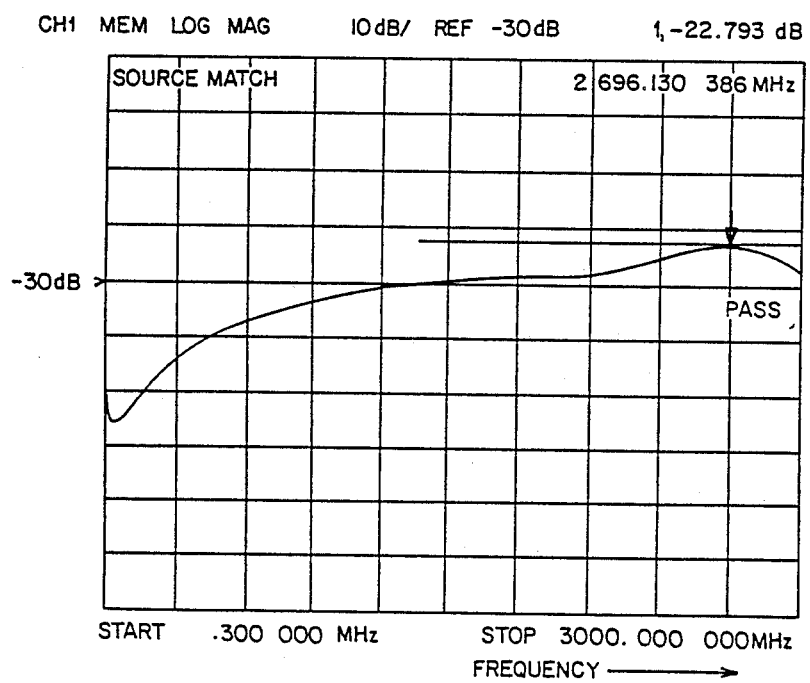
Figure 10C:
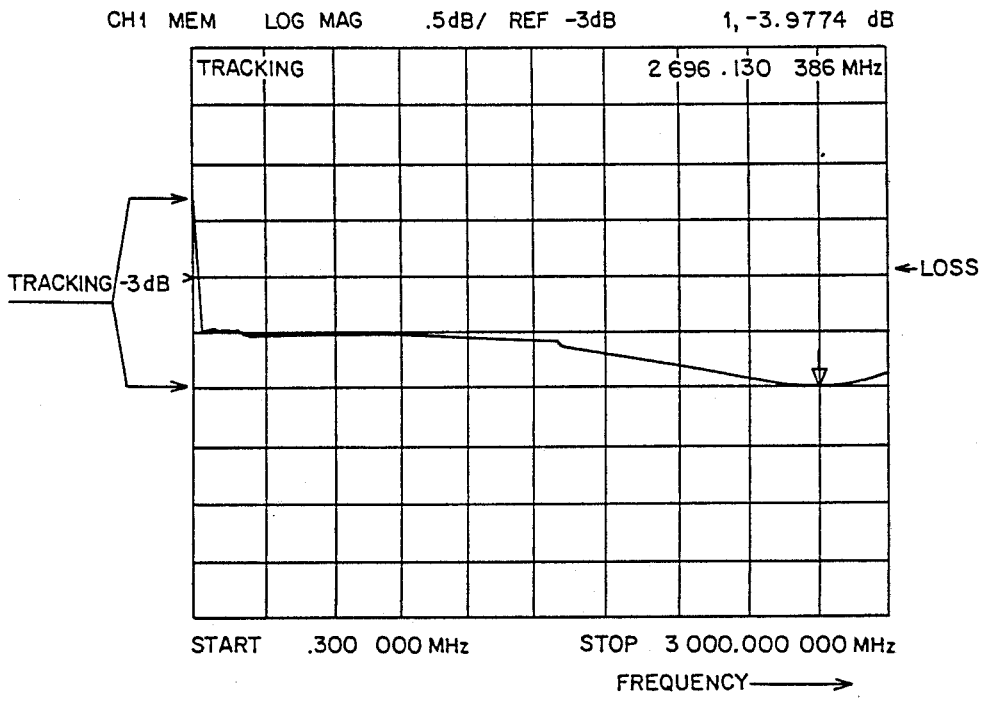
Figure 10D:
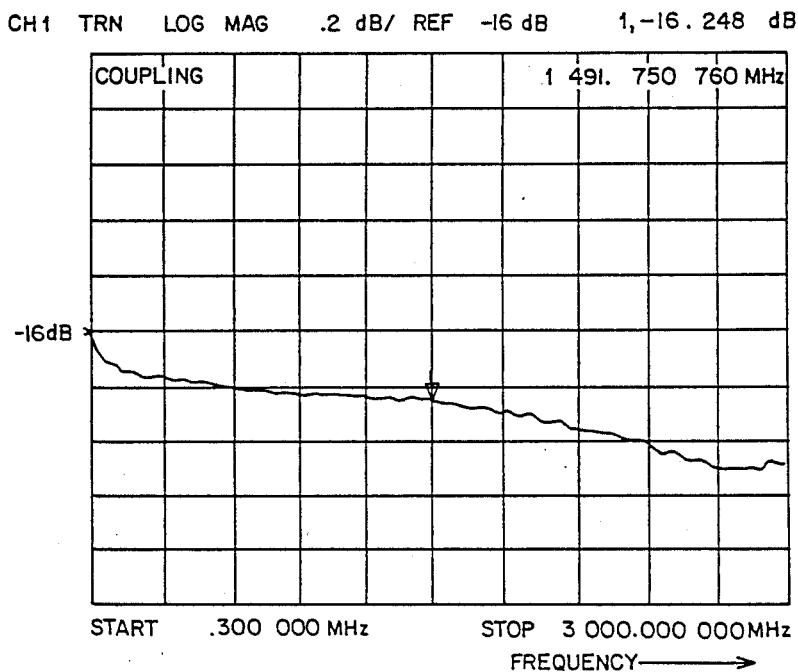

The bridge resistor 92 of directional bridge 32 is formed on a substrate 144, and the bridge resistor 114 of directional bridge 34 is formed on a substrate 146. The resistors utilized herein are thin-film resistors. The substrate 144 is mounted in a recess 148 in housing 140 as shown in FIG. 9. The substrate 146 is mounted in a recess 150 in housing 140. One side of resistor 92 is connected by a conductive pad and a gold ribbon 152 to housing 140, thereby forming a connection between resistor 92 and ground. The other side of resistor 92 is connected to a conductive pad 154 on substrate 144. Similarly, one side of resistor 114 is connected by a conductive pad and a gold ribbon 156 to housing 140. The other side of resistor 114 is connected to a conductive pad 158 on substrate 146. The mounting positions of substrates 144 and 146 are shown in FIGS. 7 and 9. The substrates 144 and 146 are mounted in housing 140 with an adhesive.

Figure 6:
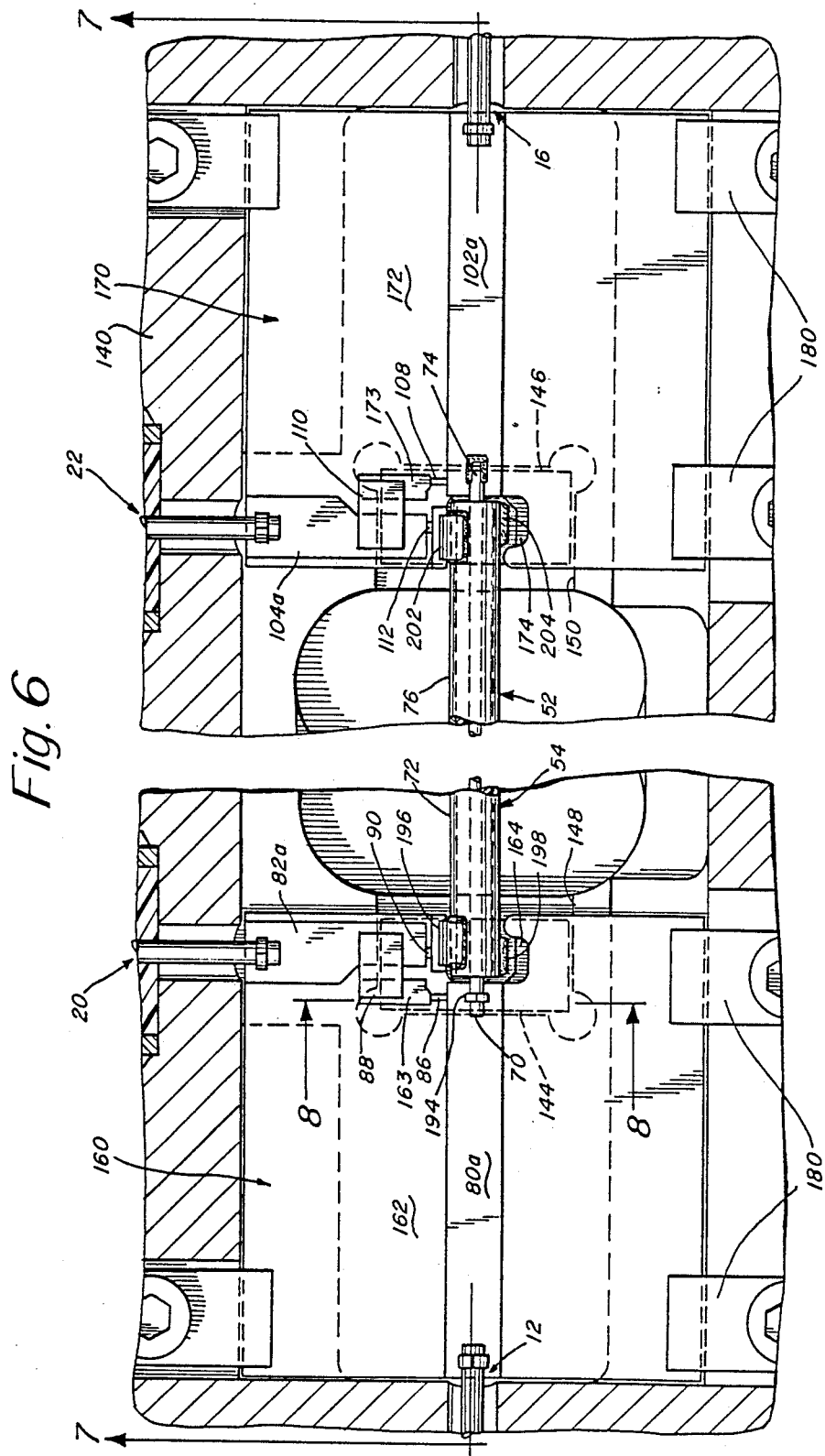
FIG. 6 is a longitudinal cross-section taken along line 6—6 of FIG. 5.

A thin-film circuit 160 containing the remainder of the elements of directional bridge 32 is illustrated in FIG. 6. A center conductor 80a of transmission line 80 and a center conductor 82a of transmission line 82 are formed as conductive strips on a substrate 162. Thin-film resistors 86 and 90 are formed on substrate 162, and capacitor 88 in the form a chip is connected between the center conductor 82a of transmission line 82 and a conductive pad 163 connected to resistor 86. Similarly, a thin-film circuit 170 containing the remaining elements of directional bridge 34 is shown in FIG. 5B. A center conductor 102a of transmission line 102 and a center conductor 104a of transmission line 104 are formed on a substrate 172. Thin film resistors 108 and 112 are formed on substrate 172, and capacitor 110 in the form of a chip is connected between the center conductor 104a of transmission line 104 and a conductive pad 173 connected to resistor 108. The substrates 162 and 172 include notches 164 and 174, respectively, for receiving the ends of coaxial transmission line 50 of dual balun 30, as shown and described hereinafter.

Referring now to FIG. 6, the thin-film circuits 160 and 170 are shown mounted in housing 140. The thin-film circuit 160 is mounted above substrate 144, and thin film circuit 170 is mounted above substrate 146. As indicated above, substrate 144 is mounted in recess 148 and substrate 146 is mounted in recess 150. Thin-film circuits 160 and 170 are retained by mounting tabs 180 and mounting screws 182.

The structural details of the dual balun 30 are shown in FIG. 4. Coaxial transmission line 50 extends from thin-film circuit 160 to thin-film circuit 170. First balun section 52 of transmission line 50 includes ferrite beads 183, 184, 185 and 186 mounted on the outer conductor 50a. Second balun section 54 of transmission line 50 includes ferrite beads 187, 188 and 189. Each of the ferrite beads 183–189 has an annular shape and is threaded over the coaxial transmission line 50. At an intermediate point of transmission line 50 between sections 52 and 54, the outer conductor 50a is grounded by a clamp 190 and clamp retaining screws 192. Preferably, the coaxial transmission line 50 is a Micro Coax Company No. UT47 or equivalent, and the ferrite beads 183–189 are Ferronics Company No. 21-110-B and No. 21-110-F or equivalent.

The details of the connections between coaxial transmission line 50, thin-film circuits 160 and 170 and substrate 144 and 146 are illustrated in the enlarged portions of FIG. 6. The center conductor 70 of balun section 54 is connected to the center conductor 80a of transmission line 80 by a gold ribbon 194. Outer conductor 72 of balun section 54 is connected to resistor 90 by a gold ribbon 196 that is soldered between outer conductor 72 and a conductive pad on thin-film circuit 160. Outer conductor 72 is connected to resistor 92 on substrate 144 (FIG. 9) by a solder bead 198 between outer conductor 72 and conductive pad 154 on underlying substrate 144.

Center conductor 74 of balun section 52 is soldered to the center conductor 102a of transmission line 102. Outer conductor 76 of balun section 52 is connected to resistor 112 by a gold ribbon 202 soldered between outer conductor 76 and a conductive pad on thin-film circuit 170. Outer conductor 76 is connected to resistor 114 on substrate 146 (FIG. 9) by a solder connection 204 between outer conductor 76 and conductive pad 158 on underlying substrate 146.

The ferrite beads 183–189 are held in fixed positions by an adhesive 193. Housing 140 includes a cover 141 which encloses the RF cavity 142.

A test set constructed in accordance with the embodiment shown and described herein performed in accordance with the following specifications.

Operating frequency range = 300 kHz to 3.0 GHz
Insertion loss = 3 dB ±0.3 dB per GHz
Directivity = 40 dB
Source match: greater than 30 dB to 1.3 GHz, greater than 20 dB to 3.0 GHz
Coupling = 16 dB ±0.3 dB.

The measured performance of a test set constructed in accordance with the present invention is illustrated in FIGS. 10A–10D. FIGS. 10A–10D are graphic representations of test set performance as a function of frequency. In each case, a frequency range of 0.3 MHz to 3,000 MHz is shown on the horizontal axis, and long magnitude of the respective parameter is shown on the vertical axis. Directivity, defined as the ratio of the signal appearing at the coupled port 22 with perfect reflection from the test port 16 (open) to the signal appearing at the coupled port 22 with no reflection from the test port 16 (load), is plotted in FIG. 10A. The vertical scale is 10 dB per division. Source match, defined as the vector average of the signals measured at the coupled port 22, with the test port 16 open and shorted, is plotted in FIG. 10B. The vertical scale is 10 dB per division. Tracking, defined as the variation in the ratio of the signals measured at the coupled port 22 to the signal measured at the reference port 20, is plotted in FIG. 10C. The vertical scale is 0.5dB per division. Coupling, defined as the ratio of the signal measured at the test port 16 to the signal measured at the coupled port 22, is plotted in FIG. 10D. The vertical scale is 0.2 dB per division.

While there has been shown and described what is at present considered the preferred embodiment of the present invention, it will be understood by those skilled in the art that various changes and modifications may be made therein without departing from the scope of the present invention as defined by the appended claims.

What is claimed is:

1. A test set for separating an incident signal supplied through a test port to a device under test and a signal from the device under test, comprising:
  a first directional bridge for separating the signal from the device under test and the incident signal and providing the signal from the device under test to a coupled port;
  a second directional bridge for separating the incident signal and the signal from the device under test and providing the incident signal to a reference port; and dual balun means for receiving unbalanced inputs through an RF source port and the test port and providing separate balanced inputs to said first directional bridge and said second directional bridge.

2. A test set as defined in claim 1 wherein said dual balun means comprises:

a coaxial transmission line having a center conductor and an outer conductor and having a first end and a second end;

means for coupling the outer conductor to ground intermediate said first and second ends, thereby defining first and second sections of said coaxial transmission line;

inductive elements on the outer conductors of the first and second sections of said coaxial transmission line;

means for coupling the first end of said coaxial transmission line to said first directional bridge; and means for coupling the second end of said coaxial transmission line to said second directional bridge.

3. A test set as defined in claim 2 wherein said inductive elements comprise ferrite beads.

4. A test set as defined in claim 2 wherein said first directional bridge includes a first DC blocking capacitor and wherein said first DC blocking capacitor is selected to match the inductive element on the first section of said coaxial transmission line.

5. A test set as defined in claim 2 wherein said second directional bridge includes a second DC blocking capacitor and wherein said second DC blocking capacitor is selected to match the inductive element on the second section of said coaxial transmission line.

6. A test set as defined in claim 2 further including an RF housing enclosing said first and second directional bridges and said dual balun means and wherein said first directional bridge comprises a first thin-film circuit means mounted adjacent to the first end of said coaxial transmission line and said second directional bridge comprises a second thin-film circuit means mounted adjacent to the second end of said coaxial transmission line.

7. A test set as defined in claim 6 wherein said first thin-film circuit means and said second thin-film circuit means each comprise an upper thin-film circuit and a lower thin-film circuit mounted in close proximity to said coaxial transmission line, each of said upper and lower thin-film circuits being mounted generally parallel to each other.

8. A test set as defined in claim 1 further including an RF housing enclosing said first and second directional bridges and said dual balun means.

9. A test set for use in measuring high frequency S-parameters with a network analyzer, comprising:

a source port for coupling to an RF signal source;

a test port for coupling to a device under test;

a reference port for monitoring a test signal supplied to the device under test;

a coupled port for monitoring a reflected signal from the device under test;

a first directional bridge for separating the reflected signal and the test signal and providing the reflected signal to the coupled port;

a second directional bridge for separating the test signal and the reflected signal and providing the test signal to the reference port;

a single balun for supplying a balanced test signal from said source port to said second directional bridge and for supplying a balanced reflected signal from said test port to said first directional bridge; and an RF housing enclosing said first and second directional bridges and said balun.

10. A test set as defined in claim 9 wherein said balun comprises;

a coaxial transmission line having a center conductor and an outer conductor and having a first end and a second end;

means for coupling the outer conductor to ground intermediate said first and second ends, thereby defining first and second sections of said coaxial transmission line;

inductive elements on the outer conductors of the first and second sections of said coaxial transmission line;

first coupling means for coupling the first end of said coaxial transmission line to said first directional bridge; and second coupling means for coupling the second end of said coaxial transmission line to said second directional bridge.

11. A test set as defined in claim 10 wherein said first directional bridge includes a first DC blocking capacitor and wherein said first DC blocking capacitor is selected to match the inductive element on the first section of said coaxial transmission line.

12. A test set as defined in claim 10 wherein said second directional bridge includes a second DC blocking capacitor and wherein said second DC blocking capacitor is selected to match the inductive element on the second section of said coaxial transmission line.

13. A test set as defined in claim 10 wherein said first directional bridge comprises as first thin film circuit means mounted adjacent to the first end of said coaxial transmission line and said second directional bridge comprises a second thin-film circuit means mounted adjacent to the second end of said coaxial transmission line.

14. A test set as defined in claim 10 wherein the test signal is coupled from said source port to the center conductor of said coaxial transmission line at the second end thereof.

15. A test set as defined in claim 14 wherein the reflected signal is coupled from said test port to the center conductor of said coaxial transmission line at the first end thereof.

16. A test set as defined in claim 15 wherein said first coupling means comprises a connection between the center conductor and said first directional bridge and a connection between the outer conductor and said first directional bridge at the first end of said coaxial transmission line.

17. A test set as defined in claim 16 wherein said second coupling means comprises a connection between the center conductor and said second directional bridge and a connection between the outer conductor and said second directional bridge at the second end of said coaxial transmission line.

18. Apparatus for measuring S parameters of a device under test, comprising:

an RF source;

a test set for separating a test signal supplied through a test port to a first port of the device under test and a reflected signal from the device under test comprising
- a first directional bridge for separating the reflected signal and the test signal and providing the reflected signal to a coupled port,
- a second directional bridge for separating the test signal and the reflected signal and providing the test signal to a reference port, and
- dual balun means for receiving an unbalanced input from the RF source through an RF source port and providing separate balanced inputs to said first directional bridge and said second directional bridge;
- a first sampler coupled to the reference port for measuring the test signal; and
- a second sampler coupled to the coupled port for measuring the reflected signal.

19. Apparatus for measuring S-parameters as defined in claim 18 further including a third sampler coupled to a second port of the device under test for measuring a transmitted signal through the device under test.

20. Apparatus for measuring S parameters of a device under test comprising:
an RF signal source;
a first test set comprising
- a first source port,
- a first test port for coupling to a first port of a device under test,
- a first reference port for monitoring a test signal supplied to the device under test,
- a first coupled port for monitoring a signal from the first port of the device under test,
- a first coupled port directional bridge for separating the signal from the first port of the device under test and the test signal and providing the signal from the first port of the device under test to the coupled port,
- a first reference port directional bridge for separating the test signal and the signal from the first port of the device under test and providing the test signal to the first reference port, and
- a first balun for supplying a balanced signal from said first source port to said first reference port directional bridge and for supplying a balanced signal from the first port of the device under test to said first coupled port directional bridge; a second test set comprising,
- a second source port,
- a second test port for coupling to a second port of the device under test,
- a second reference port for monitoring a test signal supplied to the device under test,
- a second coupled port for monitoring a signal from the second port of the device under test,
- a second coupled port directional bridge for separating the signal from the second port of the device under test and the test signal and providing the signal from the second port of the device under test to the second coupled port,
- a second reference port directional bridge for separating the test signal and the signal from the device under test and providing the test signal to the second reference port, and
- a second balun for supplying the test signal from said second source port to said second reference port directional bridge and for supplying a balanced signal from the second port of the device under test to said second coupled port directional bridge;
switching means for selectively coupling said RF signal source to said first source port or said second source port; and
means for measuring signal levels at said first and second reference port and said first and second coupled ports.

21. Apparatus for measuring S-parameters as defined in claim 20 wherein said means for measuring signal levels comprises a sampler coupled to each of said first and second reference ports and to each of said first and second coupled ports.

22. Apparatus for measuring S-parameters as defined in claim 20 wherein said means for measuring signal levels comprises a sampler coupled to each of said first and second coupled ports, a reference port sampler, and switching means for selectively coupling said reference port sampler to said first reference port or said second reference port.

* * * * *